US010629123B2

(12) United States Patent
Homura

(10) Patent No.: US 10,629,123 B2
(45) Date of Patent: Apr. 21, 2020

(54) ACTIVE-MATRIX DISPLAY DEVICE

(71) Applicant: JOLED INC., Tokyo (JP)

(72) Inventor: Shigeo Homura, Tokyo (JP)

(73) Assignee: JOLED INC., Tokyo (JP)

( * ) Notice: Subject to any disclaimer, the term of this patent is extended or adjusted under 35 U.S.C. 154(b) by 17 days.

(21) Appl. No.: 16/011,773

(22) Filed: Jun. 19, 2018

(65) Prior Publication Data

US 2019/0051241 A1 Feb. 14, 2019

(30) Foreign Application Priority Data

Aug. 8, 2017 (JP) ................ 2017-153656

(51) Int. Cl.
*G09G 3/32* (2016.01)
*H01L 27/12* (2006.01)
*G09G 3/3233* (2016.01)
*G09G 3/3283* (2016.01)
*H01L 51/52* (2006.01)
*H01L 27/32* (2006.01)

(52) U.S. Cl.
CPC ......... *G09G 3/3233* (2013.01); *G09G 3/3283* (2013.01); *H01L 27/3262* (2013.01); *H01L 27/3265* (2013.01); *H01L 51/5206* (2013.01); *H01L 51/5234* (2013.01); *G09G 2300/0842* (2013.01); *G09G 2310/0251* (2013.01); *G09G 2310/0262* (2013.01); *H01L 27/3276* (2013.01)

(58) Field of Classification Search
CPC ......... H01L 27/06; H01L 27/12; H01L 27/32; H01L 27/3276; H01L 27/1255; H01L 27/1222; H01L 27/124; H01L 27/3246; H01L 27/3248; H01L 27/3262; H01L 51/52; H01L 29/04; H01L 29/24; H01L 29/786; H01L 29/7869; G09G 3/32; G09G 3/3233; G09G 3/3283; G09G 3/3266; G09G 3/3258; G09G 3/3244; G02F 1/1368; G02F 1/1343; G02F 1/1362; G02F 1/1333; H01J 7/44; H01J 9/12

See application file for complete search history.

(56) References Cited

U.S. PATENT DOCUMENTS

2008/0246403 A1* 10/2008 Sagawa ................ G09G 3/3233
315/35
2017/0309696 A1 10/2017 Ebisuno et al.

FOREIGN PATENT DOCUMENTS

JP 2017-198809 11/2017

* cited by examiner

*Primary Examiner* — Chanh D Nguyen
*Assistant Examiner* — Nguyen H Truong
(74) *Attorney, Agent, or Firm* — Greenblum & Bernstein, P.L.C.

(57) ABSTRACT

In an active-matrix display device, each of the plurality of pixels includes a holding capacitor that includes: a gate electrode that is included in a first wiring layer and is connected to a gate of a drive transistor which drives a light-emitting element; a first source electrode that is included in a lower wiring layer disposed lower than the first wiring layer and is connected to a source of the drive transistor; and a second source electrode that is included in an upper wiring layer disposed higher than the first wiring layer and is connected to a source of the drive transistor. At least one of the first source electrode and the second source electrode protrudes toward the data line from the facing region and overlaps the gate electrode in the facing region in the plan view of the pixel matrix.

2 Claims, 9 Drawing Sheets

ACTIVE-MATRIX DISPLAY DEVICE

CROSS REFERENCE TO RELATED APPLICATION

The present application is based on and claims priority of Japanese Patent Application No. 2017-153656 filed on Aug. 8, 2017. The entire disclosure of the above identified application, including the specification, drawings and claims is incorporated herein by reference in its entirety.

FIELD

The present disclosure relates to an active-matrix display device.

BACKGROUND

Conventionally, an active-matrix display device that includes a pixel matrix including a plurality of pixel cells arranged in rows and columns has been known (for example, see Patent Literature (PTL) 1).

In general, each pixel cell of an active-matrix display device includes a drive transistor that drives a light-emitting element (for example, organic electroluminescence (EL) (Organic Light-Emitting Diode (OLED)) element) corresponding to the pixel cell, and a holding capacitor that holds the gate potential of the drive transistor. Moreover, the active-matrix display device includes, for each column in the pixel matrix, a data line for writing data in the holding capacitor of each pixel cell in the column.

CITATION LIST

Patent Literature

[PTL 1] Japanese Patent Application No. 2016-088524

SUMMARY

Technical Problem

In an active-matrix display device, parasitic capacitance is present between a holding capacitor and a data line. Therefore, when the potential of a data line for a certain column changes, the gate potentials of drive transistors of pixel cells of the column may change. This may further cause a phenomenon of changing the luminance of light-emitting elements driven by the pixel cells of the column corresponding to the data line.

In view of the above, the present disclosure has an object to provide an active-matrix display device capable of further suppressing, compared with a conventional one, change in the luminance of light-emitting elements that is caused when the potential of a data line changes and the light-emitting elements are driven by pixel cells in a column corresponding to the data line.

Solution to Problem

An active-matrix display device according to an aspect of present disclosure includes: a pixel matrix that includes a plurality of pixel cells arranged in rows and columns; and a data line that is disposed for each of the columns in the pixel matrix and is connected to each of the plurality of pixel cells in the column. Each of the plurality of pixel cells includes: a holding capacitor including: a gate electrode that is included in a first wiring layer and is connected to a gate of a drive transistor which drives a light-emitting element; a first source electrode that is included in a lower wiring layer disposed lower than the first wiring layer and is connected to a source of the drive transistor; and a second source electrode that is included in an upper wiring layer disposed higher than the first wiring layer and is connected to a source of the drive transistor. The gate electrode has a facing region that faces, in parallel, the data line connected to the pixel cell including the gate electrode, the first source electrode overlaps the gate electrode at least in the facing region in a plan view of the pixel matrix, the second source electrode overlaps the gate electrode at least in the facing region in the plan view of the pixel matrix, and at least one of the first source electrode and the second source electrode protrudes toward the data line from the facing region and overlaps the gate electrode in the facing region in the plan view of the pixel matrix.

Advantageous Effects

The active-matrix display device having the aforesaid configuration is capable of further suppressing change in the luminance of light-emitting elements that is caused when the potential of a data line changes and the light-emitting elements are driven by pixel cells in a column corresponding to the data line.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT

Hereinafter, an embodiment of an active-matrix display device according to the present disclosure is described in detail with reference to the drawings. Each embodiment described below shows a specific example of the present disclosure. Therefore, the numerical values, structural elements, and the arrangement and connection of the structural elements, for instance, presented in the following embodiment are mere examples, and therefore do not limit the scope of the present disclosure. Therefore, among the structural elements in the embodiment below, structural elements not recited in any one of independent claims which indicate the broadest concepts of the present disclosure are described as optional structural elements.

In the respective drawings, the same reference sign is given to substantially identical structural elements. Note also that each of the drawings is only a schematic diagram and is not necessarily precise representation of, for example, the film thicknesses and the ratio of the sizes of the structural elements.

Embodiment

[1. Overall Configuration]

Figure 1:
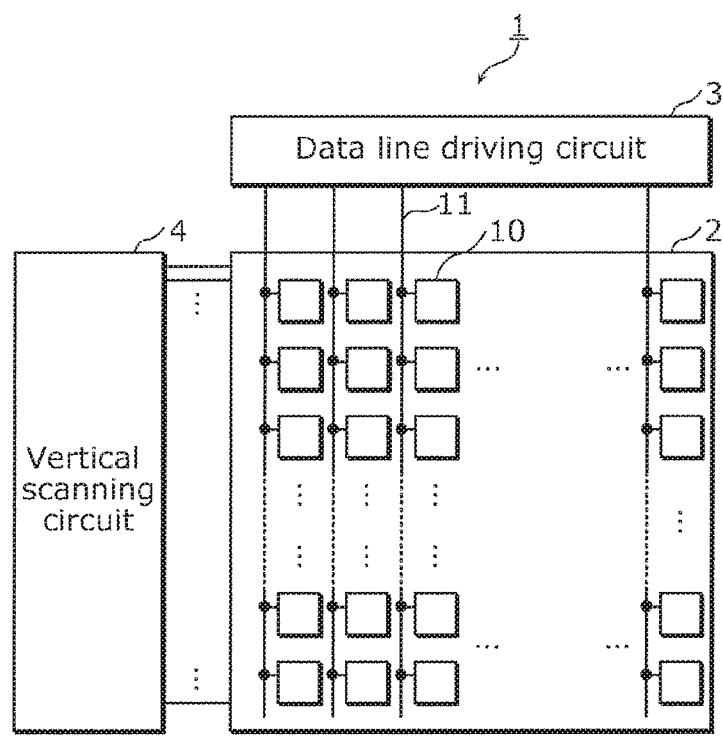
FIG. 1 is a block diagram illustrating a configuration of an active-matrix display device according to an embodiment.

FIG. 1 is a block diagram illustrating a configuration of an active-matrix display device 1 according to an embodiment.

As illustrated in FIG. 1, the active-matrix display device 1 includes a pixel matrix 2, a plurality of data lines 11, a data line driving circuit 3, and a vertical scanning circuit 4.

The pixel matrix 2 includes a plurality of pixel cells 10 arranged in rows and columns.

Figure 2:
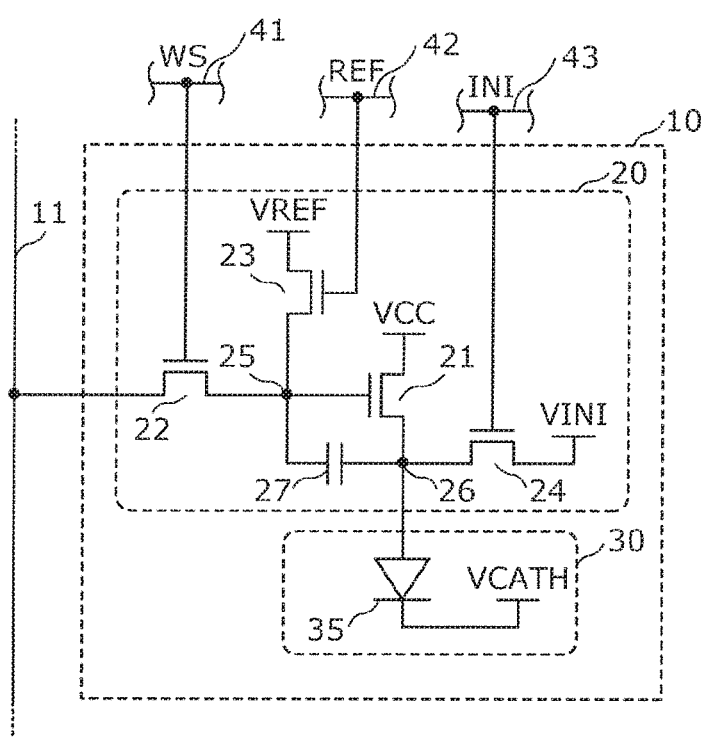
FIG. 2 is a block diagram illustrating a circuit configuration of a pixel cell according to the embodiment.

FIG. 2 is a block diagram illustrating the circuit configuration of each pixel cell 10.

As illustrated in FIG. 2, the pixel cell 10 includes a circuit unit 20 and a light-emitting unit 30.

The circuit unit 20 includes a drive transistor 21, a switch transistor 22, a reference voltage transistor 23, an initialization transistor 24, a gate node 25, a source node 26, and a holding capacitor 27. Furthermore, the light-emitting unit 30 includes a light-emitting element 35.

The switch transistor 22 has a gate terminal that is connected to a scanning line 41. The switch transistor 22 sets the potential of the gate node 25 to a data voltage of the data line 11 at the timing when the signal (WS) of the scanning line 41 is a logical value of 1. In other words, the switch transistor 22 writes the data voltage of the data line 11 into the holding capacitor 27 at the timing when the signal (SW) of the scanning line 41 is the logical value of 1.

The drive transistor 21 has a gate terminal that is connected to the gate node 25, a source terminal that is connected to the light-emitting element 35 (i.e., connected to the source node 26), and a drain terminal that is connected to a power supply VCC. With this configuration, the drive transistor 21 converts the data voltage that is set in the gate terminal via the switch transistor 22 into a signal current corresponding to the data voltage, and drives the light-emitting element 35 with the converted signal current. In other words, the drive transistor 21 drives the light-emitting element 35 with the driving capability corresponding to the data voltage written in the holding capacitor 27.

The holding capacitor 27 holds capacitance between the gate node 25 and the source node 26. In the case where the switch transistor 22 is changed from an ON state to an OFF state after the data voltage of the data line 11 is set in the gate node 25 by the switch transistor 22 when it is in the ON state, the holding capacitor 27 maintains the potential of the gate node 25 at the data voltage. This enables the drive transistor 21 to continue driving the light-emitting element 35 with the signal current corresponding to the data voltage set by the switch transistor 22 when it is in the ON state, even after the drive transistor 21 is changed to the OFF state.

The reference voltage transistor 23 has a gate terminal that is connected to a reference voltage control line 42. The reference voltage transistor 23 sets the potential of the gate node 25 to a reference voltage VREF at the timing when the signal (REF) of the reference voltage control line 42 is the logical value of 1.

The initialization transistor 24 has a gate terminal that is connected to an initialization control line 43, and initializes the potential of the source node 26 to an initializing voltage VINT at the timing when the signal (INI) of the initialization control line 43 is the logical value of 1.

The light-emitting element 35 is an element that emits light corresponding to the current amount of the signal current converted by the drive transistor 21. In other words, the light-emitting element 35 emits light with the amount of light corresponding to the driving capability of the drive transistor 21. Here, the light-emitting element 35 is an organic EL element, for example. However, the light-emitting element 35 does not necessarily need to be limited to the example of an organic EL element. For example, other examples may be considered in which the light-emitting element 35 is a light emitting diode, etc.

Figure 3:
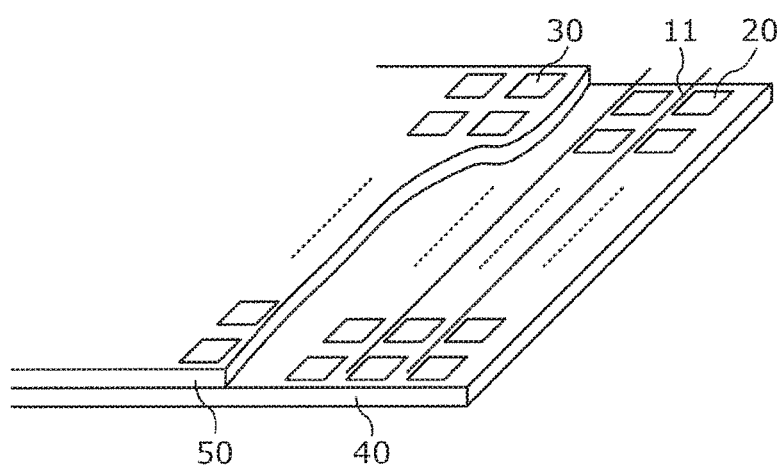
FIG. 3 is a partial cut-out perspective view of a pixel matrix according to the embodiment.

FIG. 3 is a partial cut-out perspective view of the pixel matrix 2.

As illustrated in FIG. 3, in each pixel cell 10 that is included in the pixel matrix 2, the circuit unit 20 is arranged in a transistor configuration region 40 positioned on the lower layer side in a plan view of the pixel matrix 2, and the light-emitting units 30 are arranged in an organic EL element configuration region 50 positioned on the upper layer side in the plan view of the pixel matrix 2.

The organic EL element configuration region 50 is the top layer in the plan view of the pixel matrix 2. Therefore, as illustrated in FIG. 3, the light-emitting elements 35 are arranged in an array on the surface of the pixel matrix 2. Accordingly, a display screen that displays an image is formed on the surface of the pixel matrix 2. For example, when the pixel matrix 2 includes the pixel cells 10 arranged in rows and columns, that is, 1080 rows×1920 columns, a display screen that displays an image of a full hi-vision size is formed on the surface of the pixel matrix 2.

Referring back to FIG. 1, the configuration of the active-matrix display device 1 is further described.

As illustrated in FIG. 1, the active-matrix display device 1 includes the data line 11 that is disposed for each of the columns of the pixel cells 10 in the pixel matrix 2, and connected to each of the pixel cells 10 in the column.

For the pixel matrix 2, the vertical scanning circuit 4 controls the operation of each pixel cell 10 on per a row basis via control signal lines (not illustrated) each shared on a per row basis.

The data line driving circuit 3 operates in synchronization with the vertical scanning circuit 4. The data line driving circuit 3 supplies, to each data line 11, on a per row basis controlled by the vertical scanning circuit 4, the gate voltage for writing into the holding capacitors 27 of the pixel cells 10 in the row.

[2. Layout Configuration of Pixel Cell]

Hereinafter, a layout configuration of the pixel cell 10 is described with reference to drawings.

Figure 4:
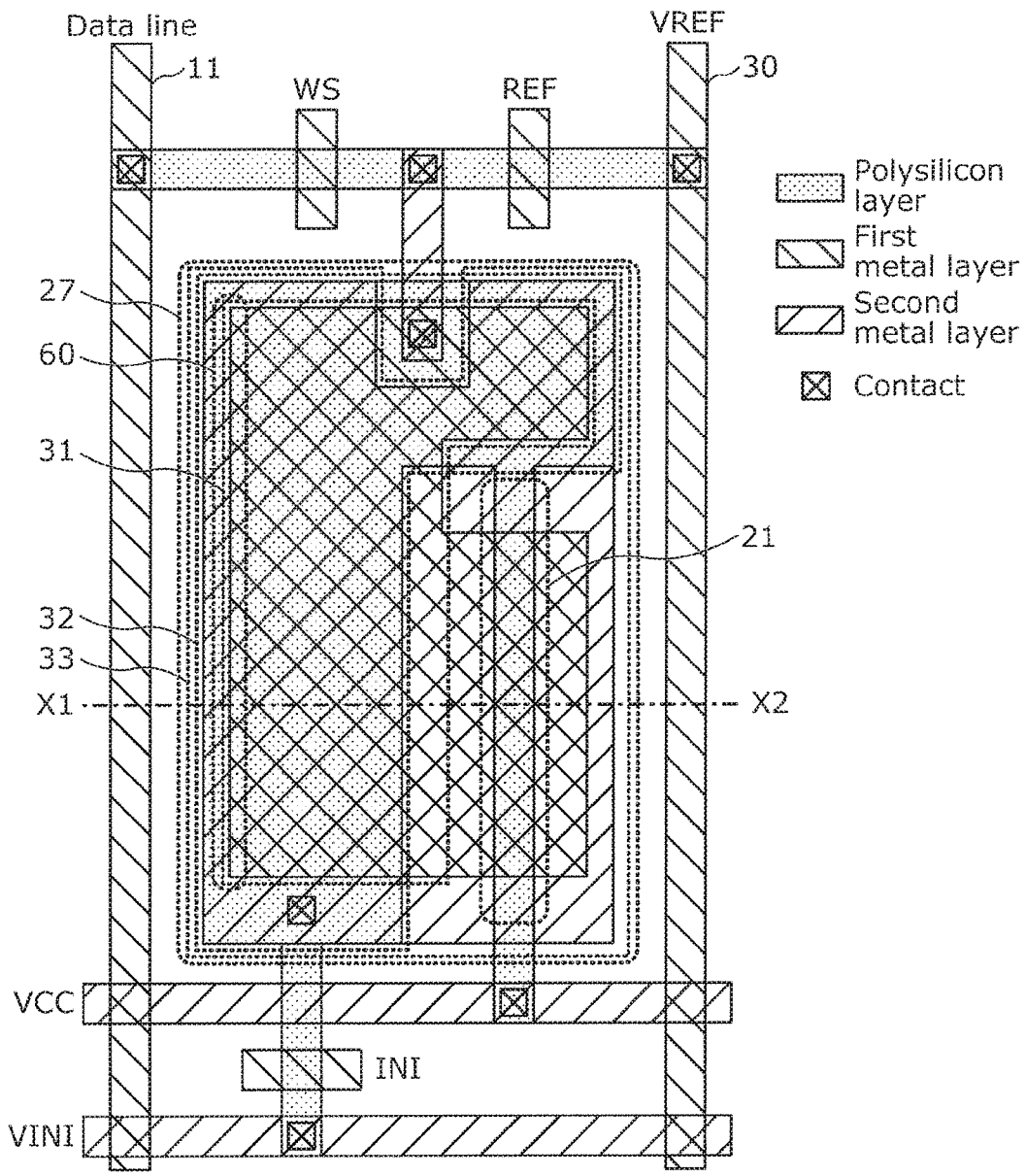
FIG. 4 is a layout diagram illustrating a layout configuration of a circuit unit in a layout configuration of the pixel cell according to the embodiment.

FIG. 4 is a layout configuration diagram in which the layout configuration part of the light-emitting unit 30 is omitted from FIG. 4 in the layout configuration of the pixel cell 10. In other words, FIG. 4 is a layout diagram illustrating the layout configuration part of the circuit unit 20 in the layout configuration of the pixel cell 10. However, in FIG. 4, illustration of the layout configuration part of each of the signal lines of INI, REF and WS in FIG. 2 is omitted so that FIG. 4 will not be complicated more than needed.

Figure 5:
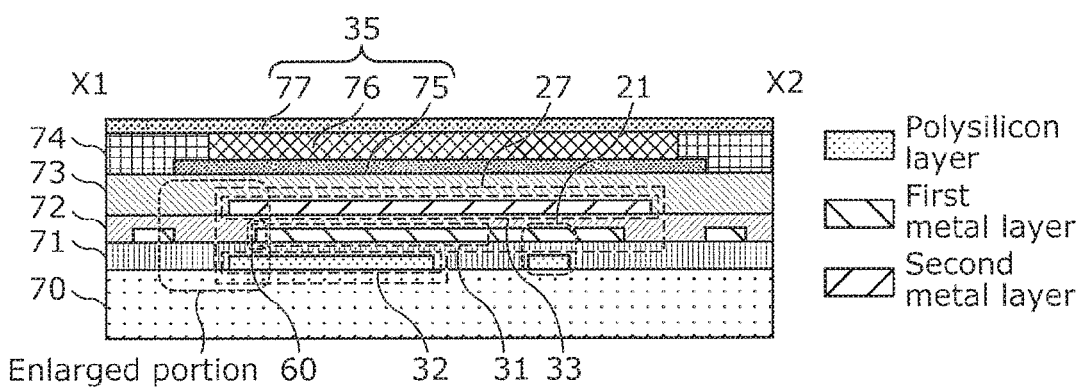
FIG. 5 is a cross-sectional layout diagram of the pixel cell according to the embodiment, taken along line X1-X2 in FIG. 4.

FIG. 5 is a cross-sectional layout diagram of the pixel cell 10 taken along the line X1-X2 in FIG. 4.

As illustrated in FIG. 5, in the plan view of the pixel matrix 2, the circuit unit 20 of the pixel cell 10 includes, on a substrate 70, a polysilicon layer, a gate insulation film 71, a first metal layer, a first interlayer insulation film 72, a second metal layer, and a second interlayer insulation film 73 that are stacked in stated order from the lower layer side to the upper layer side. Furthermore, in the plan view of the pixel matrix 2, the light-emitting unit 30 of the pixel cell 10 includes, on the second interlayer insulation film 73, an anode 75, an organic light-emitting layer 76, and a transparent cathode 77 that are stacked in stated order from the lower layer side to the upper layer side, and a bank 74 disposed between adjacent pixel cells 10.

As illustrated in FIG. 5, the light-emitting element 35 is implemented by an organic EL element having a configuration in which the organic light emitting layer 76 is interposed between the anode 75 and the transparent cathode 77.

As illustrated in FIG. 4 and FIG. 5, the data line 11 includes wiring of the first metal layer (the first wiring layer).

The holding capacitor 27 includes the gate electrode 31, the first source electrode 32, and the second source electrode 33.

The gate electrode 31 is an electrode that is formed from the first metal layer (the first wiring layer) and is connected to the gate of the drive transistor 21. Furthermore, the gate electrode 31 has a facing region 60 that faces, in parallel, the first metal layer (the first wiring layer) of the data line 11.

The first source electrode 32 is an electrode that is formed from a polysilicon layer (lower wiring layer which is a layer disposed lower than the first wiring layer) and is connected to the source of the drive transistor 21. Furthermore, the first source electrode 32 overlaps the gate electrode 31 at least in the facing region 60 in the plan view of the pixel matrix 2.

The second source electrode 33 is an electrode that is formed from the second metal layer (upper wiring layer which is a layer disposed higher than the first wiring layer) and is connected to the source of the drive transistor 21. Furthermore, the second source electrode 33 overlaps the gate electrode 31 at least in the facing region 60 in the plan view of the pixel matrix 2.

Here, both of the first source electrode 32 and the second source electrode 33 protrude toward the data line 11 from the facing region 60 and overlap the gate electrode 31 in the facing region 60.

Accordingly, the holding capacitor 27 includes a portion which holds capacitance that is achieved by interposing the gate electrode 31 between the first source electrode 32 and the second source electrode 33.

[3. Consideration]

Hereinafter, the active-matrix display device 1 of the aforesaid configuration is considered.

Figure 6:
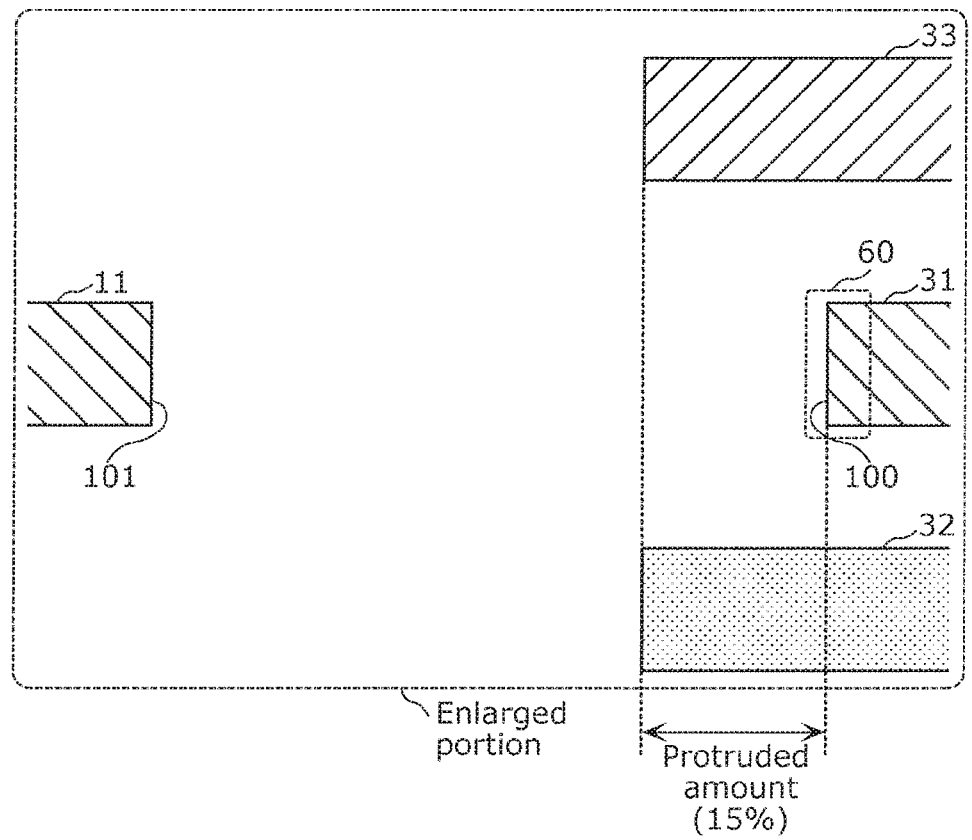
FIG. 6 is an enlarged view illustrating a portion where a data line and a gate electrode face each other in FIG. 5.

FIG. 6 is an enlarged view in which the portion (enlarged portion) where the data line 11 and the gate electrode 31 in FIG. 5 face each other is enlarged.

As illustrated in FIG. 6, the first source electrode 32 and the second source electrode 33 protrude toward the data line 11 from the facing region 60, compared with the gate electrode 31. Furthermore, each of the protruded amounts is 15% of the spacing between the data line 11 and the gate electrode 31.

In the embodiment, the active-matrix display device 1 has a feature that the first source electrode 32 and the second source electrode 33 protrude toward the data line 11 from the facing region 60, compared with the gate electrode 31.

Figure 7:
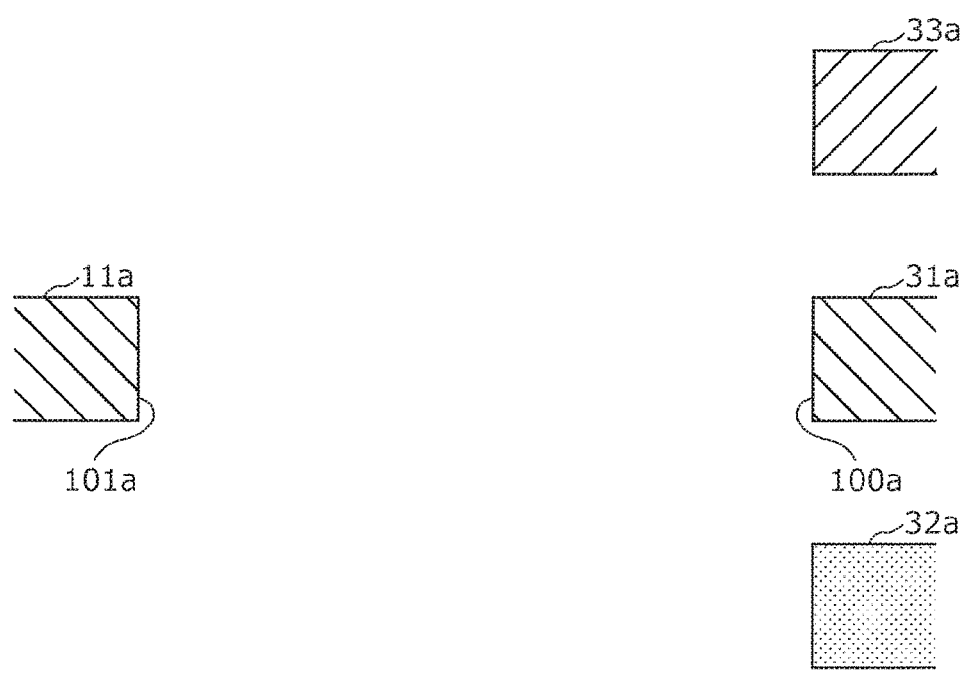
FIG. 7 is an enlarged view illustrating a portion where a data line and a gate electrode face each other in a conventional example.

FIG. 7 is an enlarged view illustrating a portion where a data line and a gate electrode face each other in a conventional example.

As illustrated in FIG. 7, conventionally, a first source electrode 32a and a second source electrode 33a do not protrude toward a data line 11a, compared with a gate electrode 31a.

Figure 8:
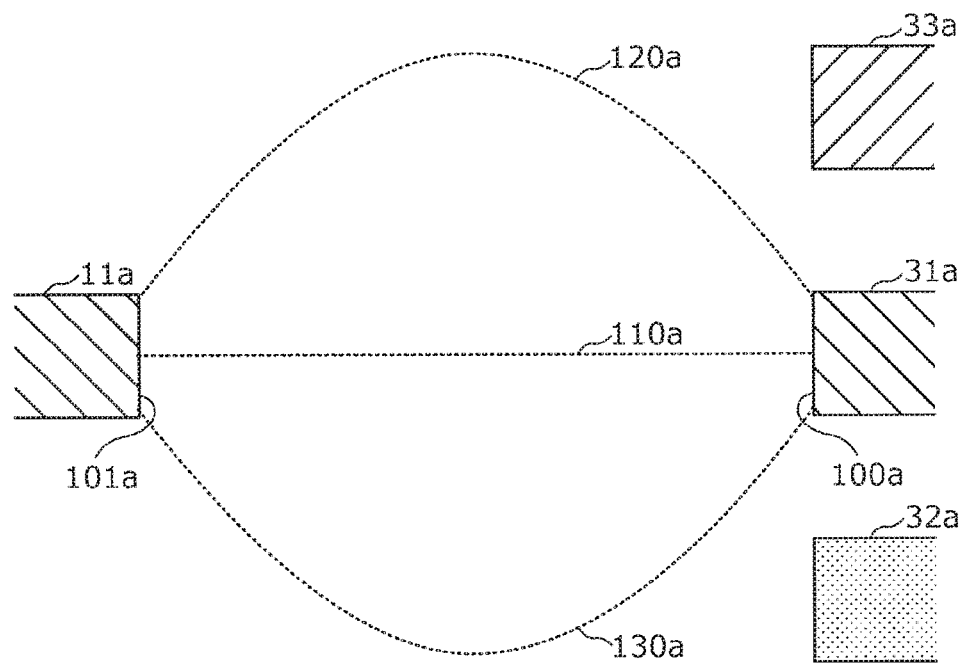
FIG. 8 is a schematic diagram indicating virtual electric lines of force in the conventional example.

FIG. 8 is a schematic diagram illustrating virtual electric lines of force in the conventional example that extend between the surface of the gate electrode 31a that faces the data line 11a (hereafter also referred to as "gate electrode-side facing surface 100a"), and the surface of the data line 11a that faces the gate electrode 31a (hereafter also referred to as "data line-side facing surface 101a").

As illustrated in FIG. 8, in the conventional example, from the gate electrode-side facing surface 100a to the data line-side facing surface 101a, the following electric lines of force are formed: an electric line of force (for example, an electric line of force 110a) that extends substantially linearly in a horizontal direction; an electric line of force (for example, an electric line of force 120a) that extends in a curve in the positive direction of the elevation angle direction; and an electric line of force (for example, an electric line of force 130a) that extends in a curve in the negative direction of the elevation angle direction.

Figure 9:
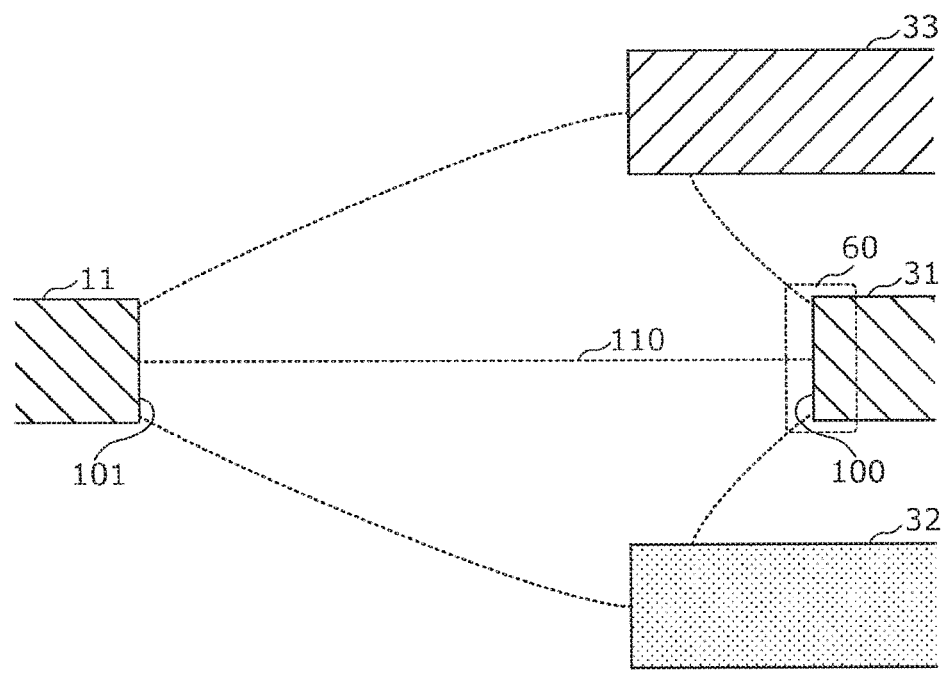
FIG. 9 is a schematic diagram illustrating virtual electric lines of force in the embodiment.

FIG. 9 is a schematic diagram illustrating virtual electric lines of force in the embodiment that extend between the surface of the gate electrode 31 that faces the data line 11 (hereafter also referred to as "gate electrode-side facing surface 100"), and the surface of the data line 11 that faces the gate electrode 31 (hereafter also referred to as "data line-side facing surface 101").

As illustrated in FIG. 9, in the embodiment, the electric line of force (for example, the electric line of force 110) that extends substantially linearly in the horizontal direction from the gate electrode-side facing surface 100 to the data line-side facing surface 110 is formed. However, since the first source electrode 32 protrudes toward the data line 11, formation of the electric line of force that extends in a curve in the positive direction of the elevation angle direction as with the electric line of force 120a in the conventional example of FIG. 8 is restricted, compared with the conventional example. Similarly, since the second source electrode 33 protrudes toward the data line 11, formation of the electric line of force that extends in a curve in the negative direction of the elevation angle direction as with the electric line of force 130a in the conventional example of FIG. 8 is restricted, compared with the conventional example.

As described above, the number of the electric lines of force formed between the gate electrode 31 and the data line 11 according to the present embodiment is less than the number of the electric lines of force formed between the gate electrode 31a and the data line 11a according to the conventional example.

In other words, the capacitance between the gate electrode 31 and the data line 11 according to the present embodiment is less than the capacitance between the gate electrode 31a and the data line 11a according to the conventional example. Accordingly, change in the potential of the gate electrode 31 that is caused when the potential of data line 11 changes is further suppressed compared with the conventional example.

Therefore, the active-matrix display device 1 according to the present embodiment is capable of further suppressing, compared with the conventional example, change in the luminance of the light-emitting elements 35 that is caused when the potential of the data line 11 changes and the light-emitting elements 35 are driven by the drive transistors 21 of the pixel cells 10 in the column corresponding to the data line 11.

Figure 10:
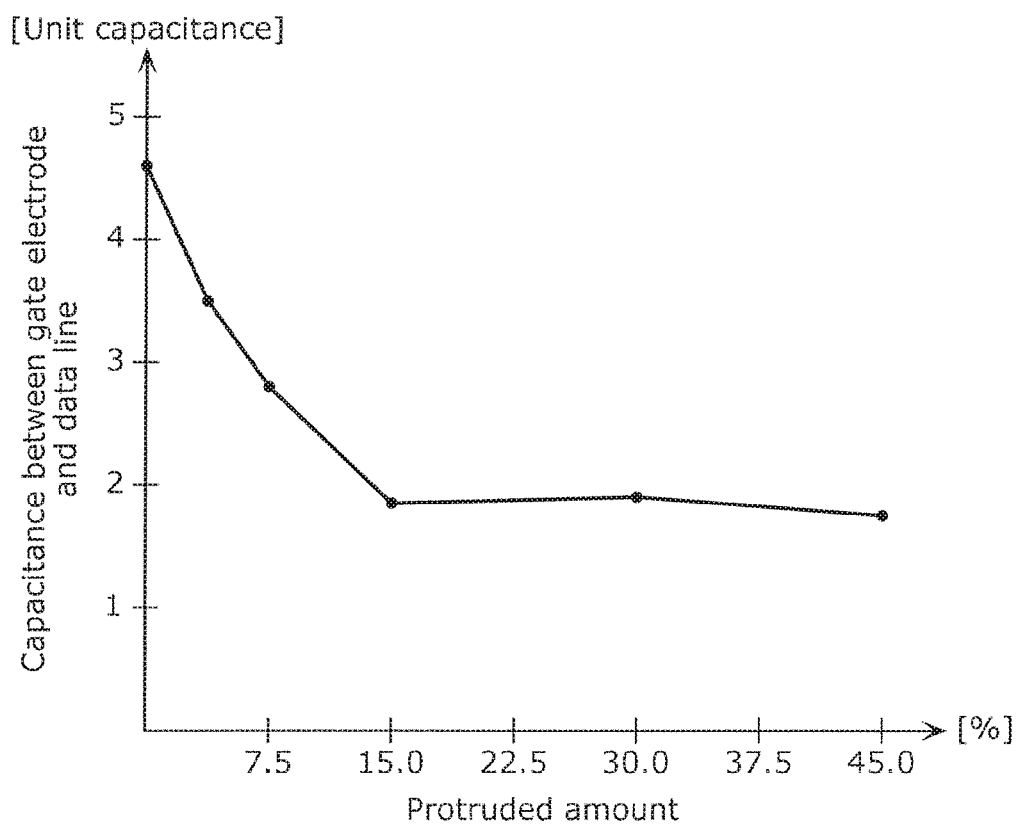
FIG. 10 is a characteristic diagram indicating the relationship between protruded amounts and the capacitance between the gate electrode and the data line.

FIG. 10 is a characteristic diagram indicating the relationship between (i) the protruded amounts of the first source electrode 32 and the second source electrode 33 and (ii) the capacitance between the gate electrode 31 and the data line 11.

As illustrated in FIG. 10, when each of the protruded amounts is from 0% to 15%, the capacitance between the gate electrode 31 and the data line 11 monotonically decreases as the protruded amount increases. For example, when the protruded amount is approximately 10%, the capacitance between the gate electrode 31 and the data line 11 is approximately ½ (halved), compared with the case where the protruded amount is 0%. Therefore, with the protruded amount of approximately 10%, the line capacitance between the gate electrode 31 and the data line 11 can be suppressed to as low as approximately ½ compared with a conventional one.

It can be understood that when the protruded amount is greater than or equal to 15%, the capacitance between the gate electrode 31 and the data line 11 is at a minimum value. Therefore, with the protruded amount of greater than or equal to 15%, the line capacitance between the gate electrode 31 and the data line 11 can be suppressed to as low as the minimum value, compared with the conventional one.

Variation

Although the active-matrix display device according to the present disclosure has been described above based on the embodiment above, the present disclosure is not limited to the embodiment described above. Other variations implemented through various changes and modifications conceived by a person of ordinary skill in the art and various kinds of equipment having the active-matrix display device according to the present disclosure may be included in the scope in an aspect or aspects according to the present disclosure, unless such changes, modifications, and equipment depart from the scope of the present disclosure.

For example, it has been described that both of the first source electrode 32 and the second source electrode 33 protrude toward the data line 11 from the facing region 60. However, as long as at least one of the first source electrode 32 and the second source electrode 33 protrudes toward the data line 11 from the facing region 60, both of the first source electrode 32 and the second source electrode 33 do not necessarily need to protrude toward the data line 11 from the facing region 60.

Figure 11A:
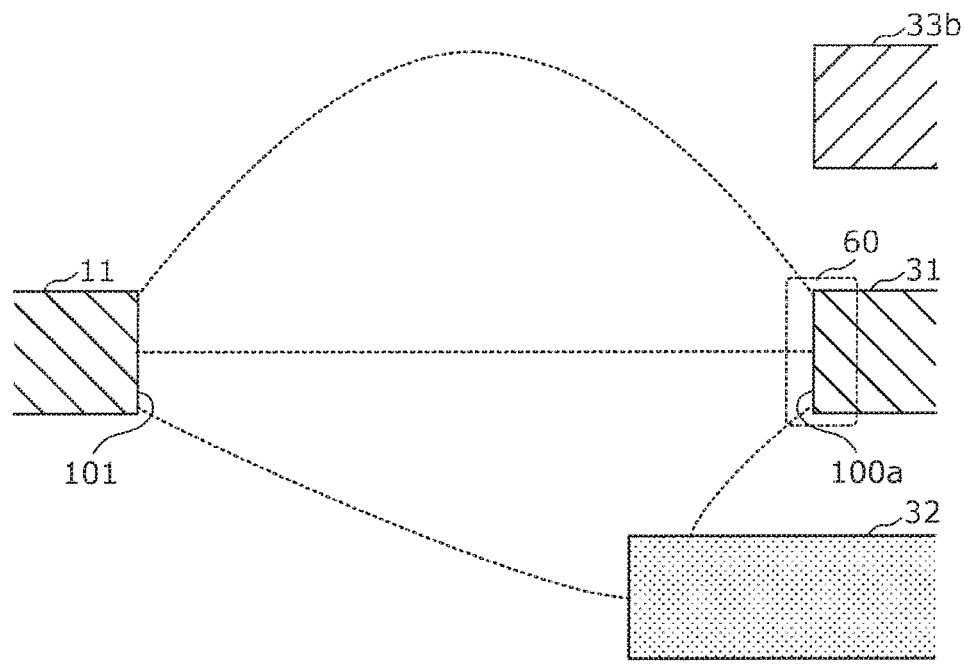
FIG. 11A is a schematic diagram indicating virtual electric lines of force in a variation.

FIG. 11A is a schematic diagram illustrating virtual electric lines of force extending between the gate electrode-side facing surface 100*a* and the data line-side facing surface 101 when only the first source electrode 32 protrudes toward the data line 11 from the facing region 60. Furthermore, FIG. 11B is a schematic diagram illustrating virtual electric lines of force extending between the gate electrode-side facing surface 100 and the data-line side facing surface 101 when only the second source electrode 33 protrudes toward the data line 11 from the facing region 60.

As illustrated in FIG. 11A, when only the first source electrode 32 protrudes toward the data line 11, due to the protruded portion of the first source electrode 32, the electric line of force that extends in a curve in the positive direction of the elevation angle direction as with the electric line of force 120*a* formed in the conventional example of FIG. 8 is restricted, compared with the conventional example. Therefore, in this case, the capacitance between the gate electrode 31 and the data line 11 is less than the capacitance between the gate electrode 31*a* and the data line 11*a* according to the conventional example.

Figure 11B:
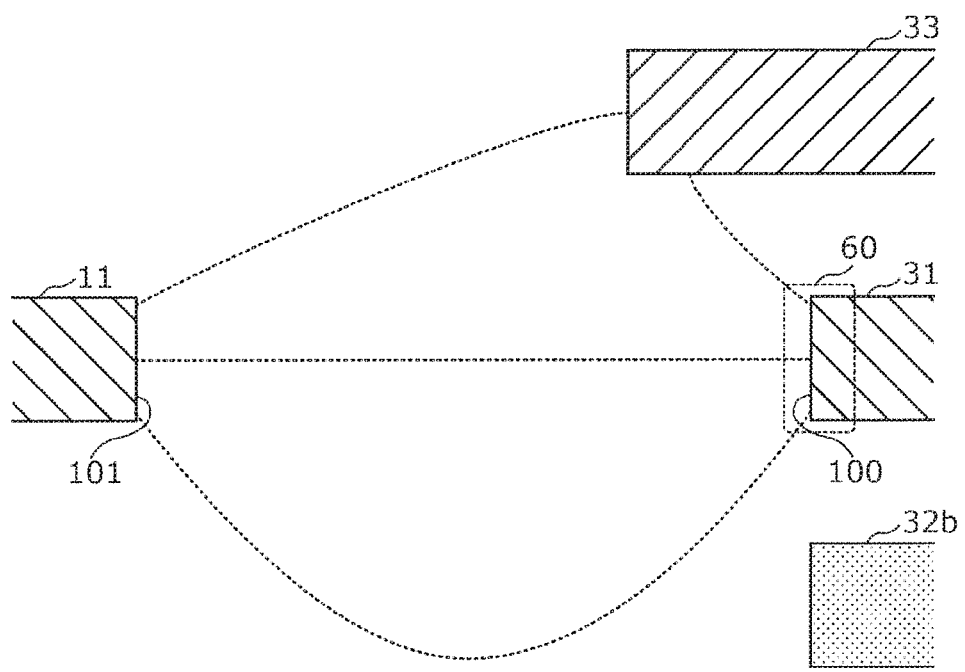
FIG. 11B is a schematic diagram illustrating virtual electric lines of force in the variation.

Similarly, as illustrated in FIG. 11B, when only the second source electrode 33 protrudes, due to the protruded portion of the second source electrode 33, the electric line of force that extends in a curve in the negative direction of the elevation angle direction as with the electric line of force 130*a* formed in the conventional example of FIG. 8 is restricted, compared with the conventional example. Therefore, in this case, the capacitance between the gate electrode 31 and the data line 11 is less than the capacitance between the gate electrode 31*a* and the data line 11*a* according to the conventional example.

As described above, as long as at least one of the first source electrode 32 and the second source electrode 33 protrudes toward the data line 11 from the facing region 60, change in the luminance of the light-emitting elements 35 is further suppressed compared with the conventional one. The change is caused when the potential of the data line 11 changes and the light-emitting elements 35 are driven by the drive transistors 21 of the pixel cells 10 in the column corresponding to the data line 11.

Moreover, for example, it has been described in the embodiment that data line 11 includes the wiring of the first metal layer (the first wiring layer). However, as long as at least one of the first source electrode 32 and the second source electrode 33 protrudes toward the data line 11 from the facing region 60, the data line 11 is not necessarily limited to the configuration including the wiring of the first metal layer (the first wiring layer).

As an example, the data line 11 may be formed from only the second metal layer (upper wiring layer). Even when the data line U is formed from only the second metal layer (upper wiring layer), a similar effect is obtained as in the case where the data line 11 has the configuration described in the embodiment.

Figure 12:
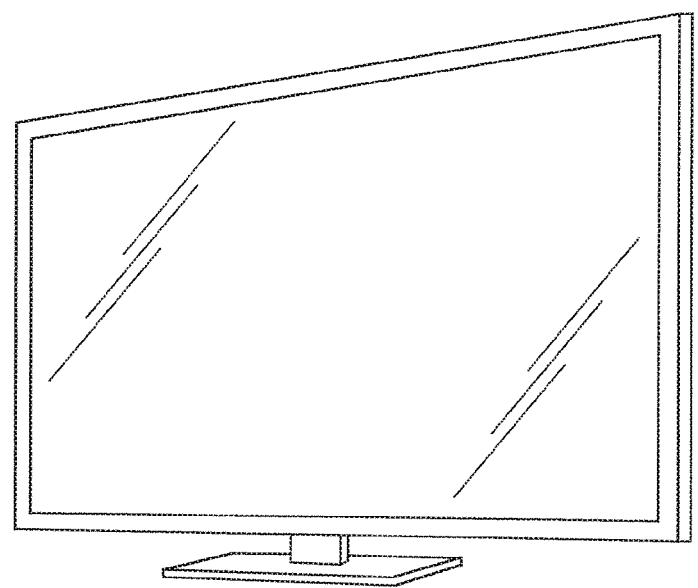
FIG. 12 is an external view of a flat display device according to the variation.

Furthermore, for example, the active-matrix display device according to the present disclosure is implemented as a flat display unit as illustrated in FIG. 12. FIG. 12 is an external view of a flat display device. Such a flat active-matrix display device is capable of further suppressing, compared with a conventional one, change in the luminance of light-emitting elements that is caused when the potential of a data line changes and the light-emitting elements are driven by pixel cells in a column corresponding to the data line.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to an active-matrix display device that includes a pixel matrix including a plurality of pixel cells arranged in rows and columns, for example.

The invention claimed is:

1. An active-matrix display device, comprising:

a pixel matrix that includes a plurality of pixel cells arranged in rows and columns; and a data line that is disposed for each of the columns in the pixel matrix and is connected to each of the plurality of pixel cells in the column, wherein each of the plurality of pixel cells includes:

a holding capacitor, including:

a gate electrode that is included in a first wiring layer and is connected to a gate of a drive transistor which drives a light-emitting element;

a first source electrode that is included in a lower wiring layer disposed lower than the first wiring layer and is connected to a source of the drive transistor; and a second source electrode that is included in an upper wiring layer disposed higher than the first wiring layer and is connected to the source of the drive transistor, the gate electrode has a facing region that faces, in parallel, the data line connected to the pixel cell including the gate electrode, the first source electrode overlaps the gate electrode at least in the facing region in a plan view of the pixel matrix, the second source electrode overlaps the gate electrode at least in the facing region in the plan view of the pixel matrix, at least one of the first source electrode and the second source electrode protrudes toward the data line from the facing region and overlaps the gate electrode in the facing region in the plan view of the pixel matrix, and a protruded amount that is an amount of protrusion toward the data line is greater than or equal to 15% of a distance between the data line and the gate electrode in the facing region.

2. The active-matrix display device according to claim 1, wherein both of the first source electrode and the second source electrode protrude toward the data line from the facing region and overlap the gate electrode in the facing region in the plan view of the pixel matrix.

* * * * *